(12) United States Patent
Chen

(10) Patent No.: US 9,678,158 B2
(45) Date of Patent: Jun. 13, 2017

(54) APPARATUS FOR TESTING A PACKAGE-ON-PACKAGE SEMICONDUCTOR DEVICE

(71) Applicant: CHROMA ATE INC., Kueishan Hwaya Technical Park, Taoyuan County (TW)

(72) Inventor: Chien-Ming Chen, Taoyuan County (TW)

(73) Assignee: CHROMA ATE INC., Kueshan Hwaya Techincal Park, Taoyuan County (TW)

( * ) Notice: Subject to any disclaimer, the term of this patent is extended or adjusted under 35 U.S.C. 154(b) by 128 days.

(21) Appl. No.: 14/644,552

(22) Filed: Mar. 11, 2015

(65) Prior Publication Data

US 2015/0260793 A1 Sep. 17, 2015

(30) Foreign Application Priority Data

Mar. 12, 2014 (TW) .............................. 103204156 U

(51) Int. Cl.
*G01R 31/00* (2006.01)
*G01R 31/3185* (2006.01)
*G01R 31/28* (2006.01)
*G01R 1/04* (2006.01)

(52) U.S. Cl.
CPC . *G01R 31/318513* (2013.01); *G01R 31/2863* (2013.01); *G01R 1/04* (2013.01)

(58) Field of Classification Search
CPC ............ G01R 31/2863; G01R 31/2886; G01R 31/2831; G01R 31/2889; G01R 1/0483; G01R 1/0408; G01R 1/0433; H05K 1/0206
See application file for complete search history.

(56) References Cited

U.S. PATENT DOCUMENTS

| 4,696,525 A * | 9/1987 | Coller .................. H05K 7/1046 439/69 |
| 5,318,451 A * | 6/1994 | DelPrete .............. H05K 7/1023 439/331 |
| 2009/0317988 A1* | 12/2009 | Lin ...................... G01R 1/0466 439/68 |
| 2012/0181673 A1* | 7/2012 | Pagaila ................. H01L 21/568 257/659 |
| 2012/0252243 A1* | 10/2012 | Chan .................... G01R 1/0458 439/197 |

\* cited by examiner

*Primary Examiner* — Minh N Tang
(74) *Attorney, Agent, or Firm* — Bui Garcia-Zamor; Jessica H. Bui, Esq.

(57) ABSTRACT

An apparatus for testing a package-on-package semiconductor device includes a top cover, a lower base, a heat dissipation module, and a plurality of probes. The lower base is disposed under the top cover so as to form an internal accommodation space for receiving an upper chip. The heat dissipation module includes a heat sink arranged in the internal accommodation space and attached to an upper surface of the upper chip. The probes are arranged in the lower base so as to electrically connect the upper chip with a lower chip. By the heat sink arranged in the internal accommodation space formed of the top cover and the lower base, heat generated from the upper chip during operation of the upper chip can be greatly dissipated so that the performance and the service life of the upper chip can be improved.

7 Claims, 5 Drawing Sheets

APPARATUS FOR TESTING A PACKAGE-ON-PACKAGE SEMICONDUCTOR DEVICE

BACKGROUND OF THE INVENTION

Field of the Invention

The present invention relates to an apparatus for testing a package-on-package device, particularly to an apparatus for testing electrical characteristics or functions of a package-on-package semiconductor device.

Description of the Related Art

FIG. 4 shows a schematic sectional view of a general package-on-package semiconductor device. The so-called package-on-package technology means that two or more elements are packaged in a way of vertical stacking or back carrying. As shown in FIG. 4, generally, the package comprises a lower chip 91 and an upper chip 92, wherein the lower chip 91 is typically an integrated digital or mixed signal logic chip, for example, a baseband processor, or a multimedia processor, and the upper chip 92 is typically an integrated memory chip, for example, DRAM or Flash. Accordingly, the advantages of the stacked package reside in compacting the package so as to reduce the whole volume, simplifying the circuitry of the mother board, as compared with the conventional side-by-side package, and improving the frequency performance by the direct connection of a memory chip with a logic circuit.

FIG. 5 shows a sectional view of a conventional apparatus for testing a package-on-package device. As shown in FIG. 5, the conventional testing apparatus includes a jig head 93 holding the upper chip 92 and a test base 94 carrying the lower chip 91 thereon. During a test process, the jig head 93 is lowered to be in contact with the test base 94, and a plurality of probes 95 disposed on the jig head 93 are in electrical contact with the lower chip 91 so that the upper chip 92 and the lower chip 91 are electrically connected with each other.

However, as the capability of the lower chip 91 to be tested becomes more powerful, the entire test process tends to be complex. The load on either the upper chip 92 or the lower chip 91 becomes larger. As a result, high temperature and great heat occur. On the other hand, materials used for the conventional testing apparatus are mostly engineering plastics, such as PEEK (polyetheretherketone), which is heat resistant but has poor thermal conductivity, and hence it is difficult to dissipate the heat generated during the test process. Since the conventional testing apparatus is not provided with heat dissipation means, accumulation of the heat generated by either the upper chip 92 or the lower chip 91 for a long time may disadvantageously affect the performance or the service life of the chip and even damage the chip.

SUMMARY OF THE INVENTION

The main object of the present invention is to provide an apparatus for testing a package-on-package semiconductor device capable of dissipating heat generated by an upper chip and a lower chip by means of a heat dissipation module so as to enhance the performance and the service life of these chips and improve the test accuracy.

According to one aspect of the present invention, an apparatus for testing a package-on-package semiconductor device according to the present invention includes:

a top cover;

a lower base arranged under the top cover, the top cover and the lower base forming an internal accommodation space for receiving an upper chip;

a heat dissipation module including a heat sink, which is arranged in the internal accommodation space and attached to an upper surface of the upper chip; and a plurality of probes arranged in the lower base for electrically connecting the upper chip with a lower chip.

With the arrangement of the heat sink in the internal accommodation space formed of the top cover and the lower base, heat generated by the upper chip during operation can be dissipated greatly so as to enhance the performance and the service life of the upper chip.

Preferably, the heat dissipation module further includes a heat conduction block, the lower base includes a hollow portion, and the heat conduction block is arranged in the hollow portion between the upper chip and the lower chip. In addition to heat dissipation for the upper chip, with the arrangement of the heat conduction block, heat dissipation for the lower chip is possible. For example, heat generated by the lower chip during operation may be transferred to the upper chip through the heat conduction block and then transferred to the heat sink for heat dissipation.

Preferably, the plurality of probes may be distributed around the hollow portion, and each of the probes penetrates the lower base and protrudes out of an upper surface and a lower surface of the lower base so as to be in electrical contact with the upper chip and with the lower chip. By means of the probes penetrating the lower base and protruding out of the upper surface and the lower surface of the lower base, the upper chip and the lower chip are electrically connected with each other.

Preferably, the apparatus according to the present invention further includes a suction nozzle, wherein the heat conduction block includes a bottom recess and a negative pressure passage, the suction nozzle is received in the bottom recess, and the negative pressure passage is communicated with the suction nozzle and coupled to a negative pressure source. The lower base may include a negative pressure source channel, through which the negative pressure passage of the heat conduction block is communicated with the negative pressure source. The apparatus according to the present invention may further include an O ring which is arranged at an interface between the negative pressure source channel of the lower base and the negative pressure passage of the heat conduction block. The suction nozzle located on the lower side of the heat conduction block is provided for picking the lower chip. During the test process, the suction nozzle is received in the bottom recess of the heat conduction block so that the heat conduction block is in direct contact with the lower chip for conducting the heat generated by the lower chip.

The top cover may include an aperture, the heat sink may include a bottom plate portion and a fin portion vertically provided on the bottom plate portion, a lower surface of the heat sink is attached to the upper surface of the upper chip, and the fin portion is extended out of the aperture. In other words, the bottom plate portion of the heat sink is configured to be in contact with the upper chip for heat conduction, and the fin portion of the heat sink extended out of the top cover is configured to dissipate heat into the atmosphere.

Preferably, the apparatus according to the present invention further includes at least one spring, which is provided in the internal accommodation space between the top cover and the bottom plate portion of the heat sink. The spring is capable of cushioning the impact on the heat sink, the heat conduction block and the upper chip when the lower chip is picked up or when the heat conduction block is lowered to be in contact with the lower chip. The spring is also capable of allowing the heat sink to be tightly biased against the upper chip and then allowing the upper chip to be tightly biased against the probes.

According to another aspect of the present invention, an apparatus for testing a package-on-package semiconductor device includes:

an upper chip carrier for carrying an upper chip; and
a heat dissipation module provided on the upper chip carrier, wherein the heat dissipation module includes a heat sink, which is in contact with an upper surface of the upper chip. With the arrangement of the heat sink arranged on the upper surface of the upper chip, heat generated by the upper chip can be dissipated so as to enhance the performance and the service life of the upper chip.

Preferably, the heat dissipation module of the apparatus according to the present invention further includes a heat conduction block, which is arranged on a lower surface of the upper chip and in contact with an upper surface of a lower chip. In addition to the heat dissipation for the upper chip, by means of the heat conduction block, heat dissipation for the lower chip is possible so that the performance and the service life of the both chips are enhanced, and the test accuracy of the apparatus may also be improved.

DETAILED DESCRIPTION OF THE PREFERRED EMBODIMENT

Figure 1:
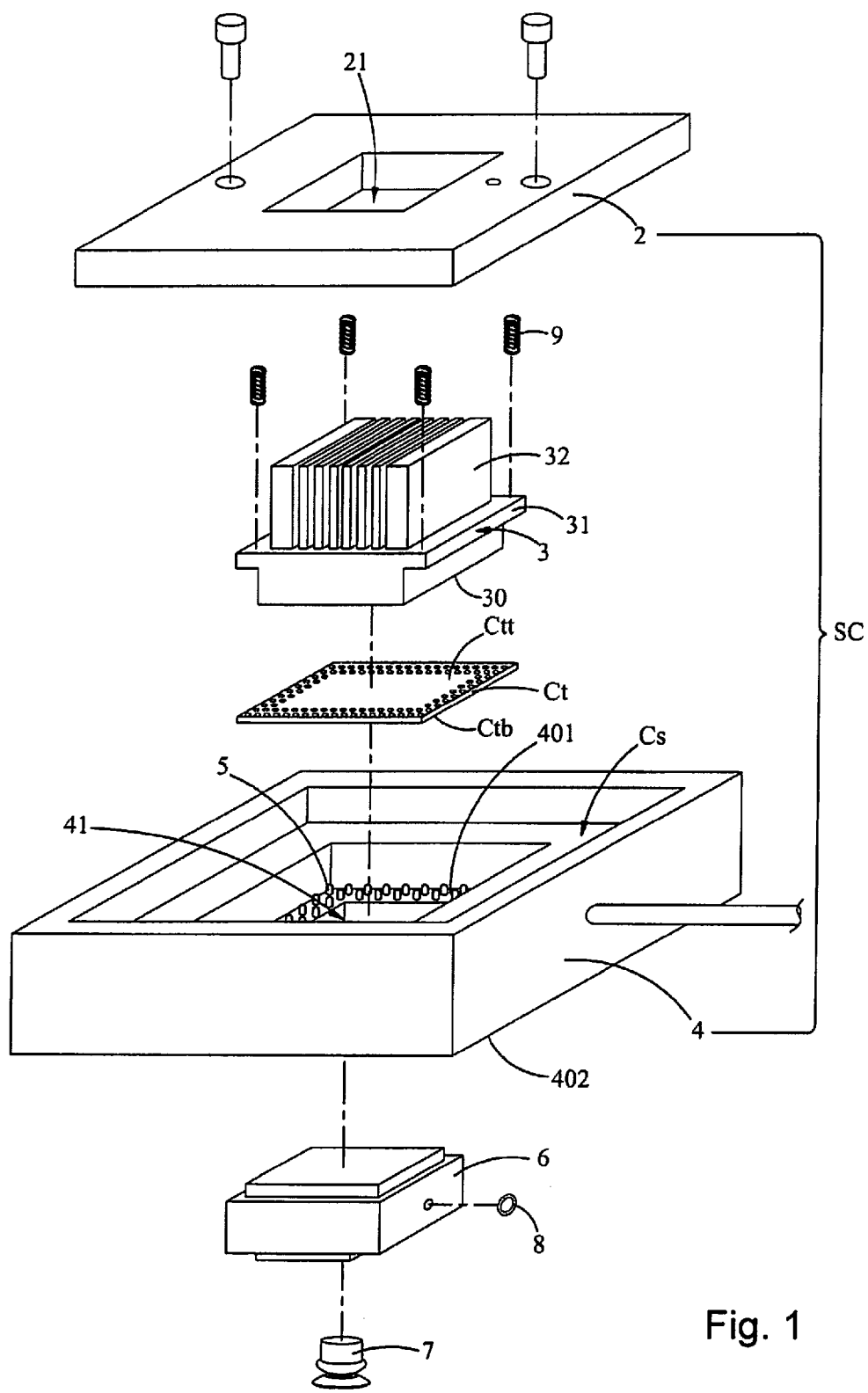
FIG. 1 is an exploded view showing a preferred embodiment according to the present invention.

In the following description of an apparatus for testing a package-on-package semiconductor device according to the present invention, the same elements are always designated by the same reference numerals.

Figure 2:
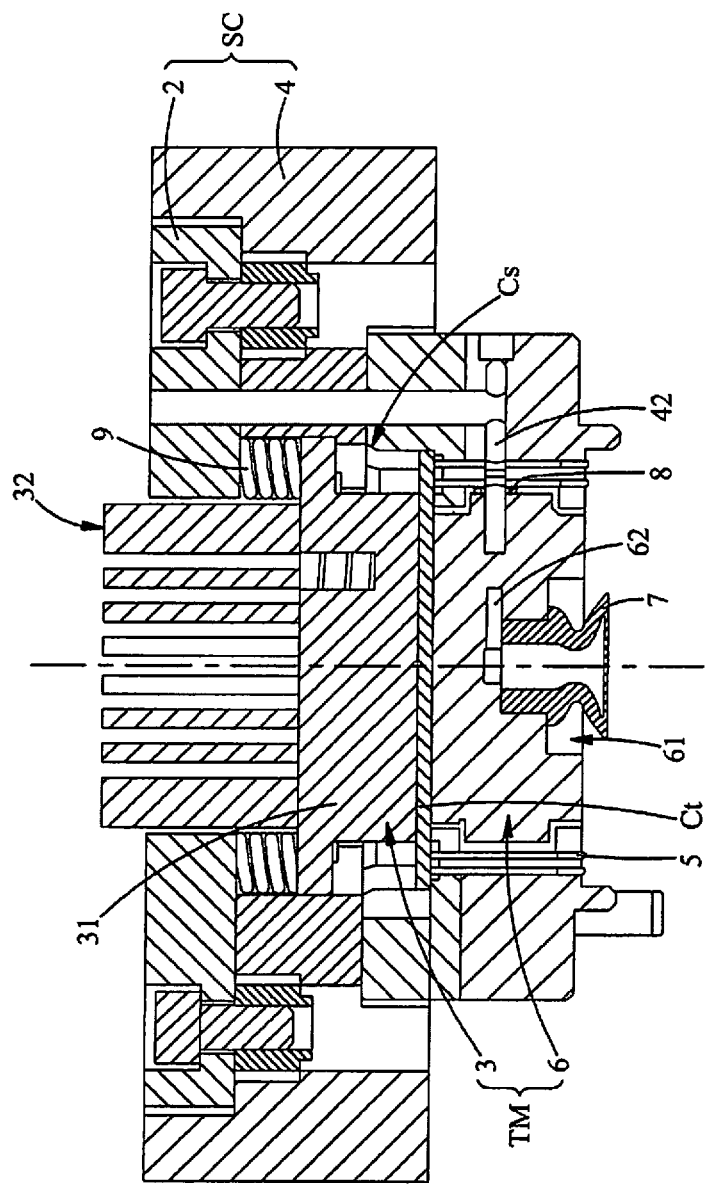
FIG. 2 is a sectional view showing the preferred embodiment according to the present invention.
Figure 3:
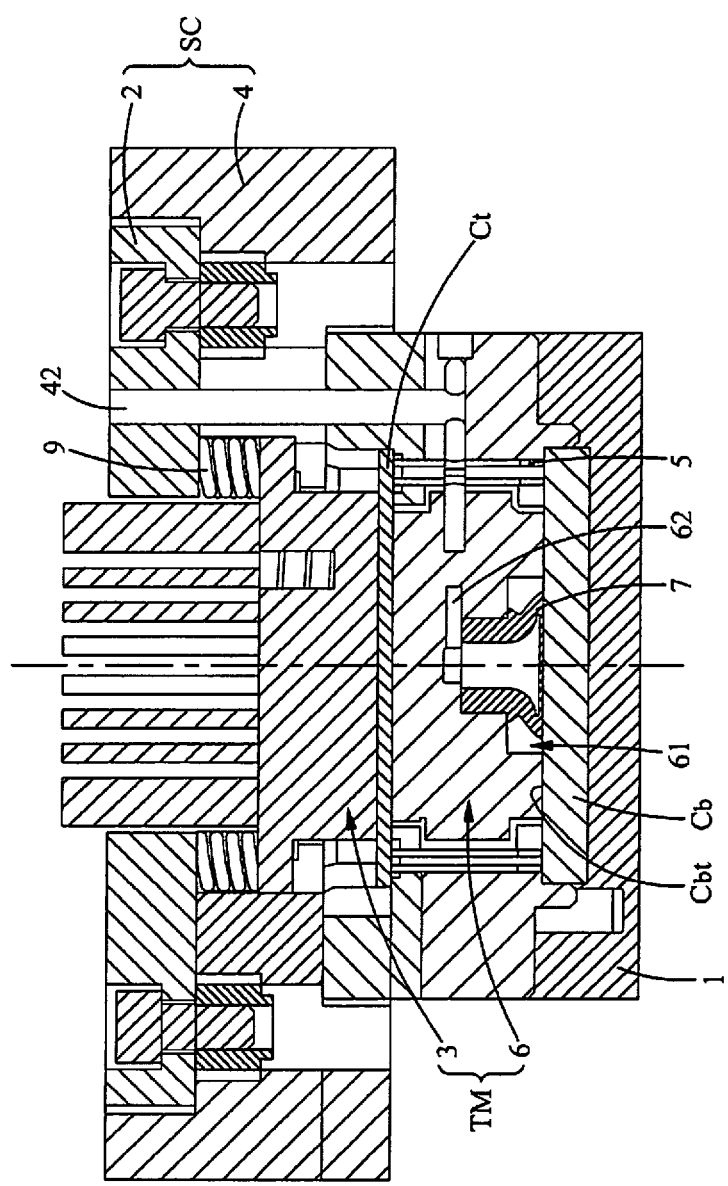
FIG. 3 is a sectional view showing the preferred embodiment according to the present invention when a test process is carried out.
Figure 4:
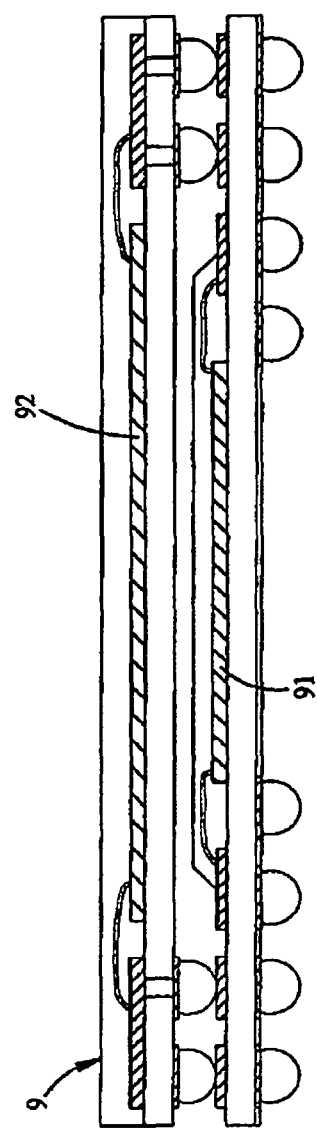
FIG. 4 is a schematic sectional view showing a general package-on-package semiconductor device.
Figure 5:
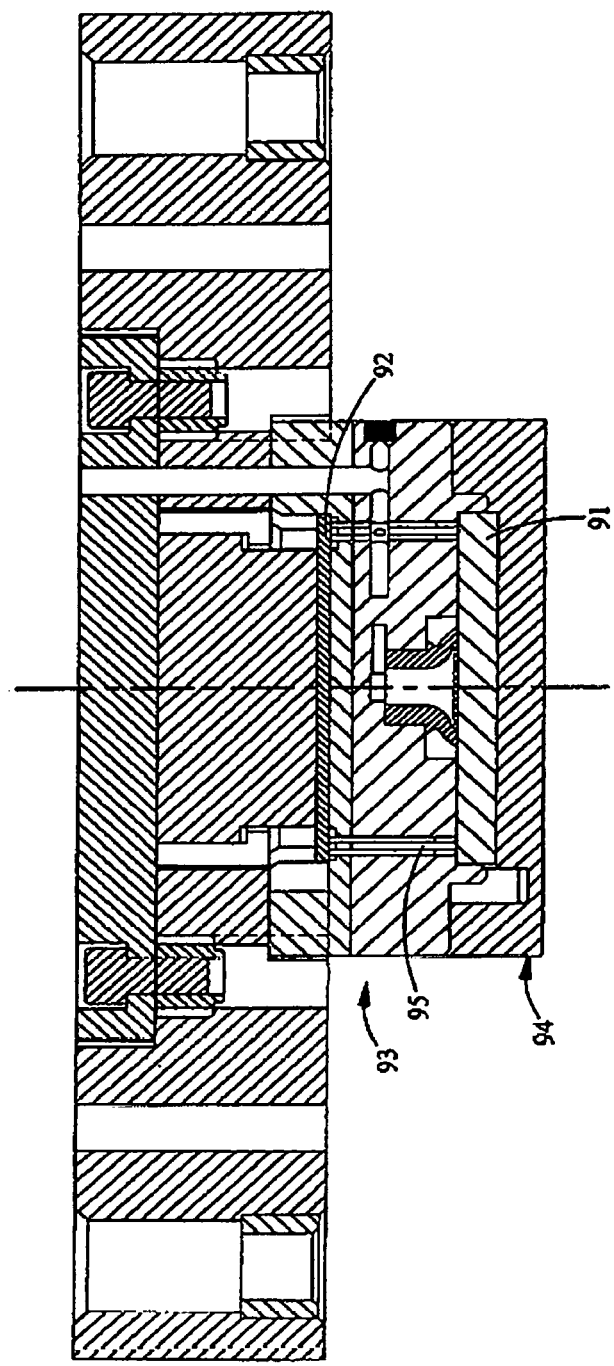
FIG. 5 is a sectional view of a conventional apparatus for testing a package-on-package semiconductor device.

With reference to FIGS. 1 to 3, FIG. 1 is an exploded view showing a preferred embodiment according to the present invention; FIG. 2 is a sectional view showing the preferred embodiment according to the present invention; and FIG. 3 is a sectional view showing the preferred embodiment according to the present invention when a test process is carried out. As shown in FIG. 3, an apparatus for testing a package-on-package semiconductor device of the embodiment includes an upper chip carrier SC for carrying an upper chip Ct, typically a memory chip, and a lower chip base 1 for holding a lower chip Cb to be tested, for example a processor or the like.

The upper chip carrier SC includes a top cover 2, a lower base 4, a heat dissipation module TM, a suction nozzle 7, four springs 9 and a plurality of probes 5. The top cover 2 is disposed on the lower base 4 so that the top cover 2 and the lower base 4 forms an internal accommodation space Cs. The top cover 2 is formed with an aperture 21. The lower base 4 is formed with a hollow portion 41.

In the present embodiment, not only the upper chip Ct but also the heat dissipation module TM is accommodated in the internal accommodation space Cs. The heat dissipation module TM includes a heat sink 3 and a heat conduction block 6. The heat sink 3 and the heat conduction block 6 may be formed of material having great thermal conductivity, such as copper (Cu), aluminum (Al) or other metal or non-metal material.

A lower surface 30 of the heat sink 3 is attached to an upper surface Ctt of the upper chip Ct. The heat conduction block 6 is provided in the hollow portion 41 of the lower base 4 and in contact with a lower surface Ctb of the upper chip Ct. The heat sink 3 includes a bottom plate portion 31 and a fin portion 32 vertically provided on the bottom plate portion 31. A lower surface 30 of the bottom plate portion 31 is attached to the upper surface Ctt of the upper chip Ct. The fin portion 32 is extended out of the aperture 21 for dissipating heat into the atmosphere.

By means of the heat sink 3, heat generated by the upper chip Ct during operation can be dissipated greatly so as to enhance the performance and the service life of the upper chip Ct. In addition to heat dissipation for the upper chip Ct, by means of the heat conduction block 6, heat dissipation for the lower chip Cb is possible. For example, heat generated by the lower chip Cb during operation may be transferred to the upper chip Ct via the heat conduction block 6 and then transferred to the heat sink 3 for heat dissipation.

The plurality of probes 5 are arranged in the lower base 4 and distributed around the hollow portion 41. Each of the probes 5 penetrates the lower base 4 and protrudes out of an upper surface 401 and a lower surface 402 of the lower base 4 so as to be in electrical contact with the upper chip Ct and with the lower chip Cb. As a result, the upper chip Ct and the lower chip Cb are electrically connected with each other.

The heat conduction block 6 includes a bottom recess 61 and a negative pressure passage 62. The bottom recess 61 is formed on a lower surface, to be attached to the lower chip Cb, of the heat conduction block 6. The suction nozzle 7 is received in the bottom recess 61 and communicated with the negative pressure passage 62. The base 4 includes a negative pressure source channel 42 communicated with the negative pressure passage 62 of the heat conduction block 6 and with a negative pressure source (not shown). The apparatus of the present embodiment further comprises an O ring 8 arranged at an interface between the negative pressure source channel 42 of the lower base 4 and the negative pressure passage 62 of the heat conduction block 6 for the sealing purpose.

The suction nozzle 7 which is communicated with the negative pressure source via the negative pressure passage 62 and the negative pressure source channel 42 and which is located on the lower side of the heat conduction block 6 serves to pick up the lower chip Cb. The suction nozzle 7 in the present embodiment may have flexibility. The upper chip carrier SC is lowered toward the lower chip base 1 so that the heat conduction block 6 is in direct contact with the lower chip Cb for heat conduction with the suction nozzle 7 being entirely received in the bottom recess 61 as shown in FIG. 3.

As shown in FIG. 1, the four springs 9 are provided in the internal accommodation space Cs and compressed between the top cover 2 and the bottom plate portion 31 of the heat sink 3. In other words, the bottom plate portion 31 of the heat sink 3 is biased at its four corners by the four springs 9. The four springs 9 are capable of cushioning the impact on the heat sink 3, the heat conduction block 6 and the upper chip Ct when the lower chip Cb is picked up or when the heat conduction block 6 is lowered to be in contact with the lower chip Cb. The four springs 9 are also capable of allowing the heat sink 3 to be tightly biased against the upper chip Ct and then allowing the upper chip Ct to be tightly biased against the probes.

Although the preferred embodiment of the present invention has been shown and described in detail, it should be understood that various changes and modifications may be made without departing from the spirit or scope of the appended claims.

DESCRIPTION OF REFERENCE NUMERALS

The Prior Art
91 lower chip
92 upper chip
93 jig head
94 test base
95 probe
The Present Invention
1 lower chip base
2 top cover
21 aperture
3 heat sink
30 lower surface
31 bottom plate portion
32 fin portion
4 lower base
401 upper surface
402 lower surface
41 hollow portion
42 negative pressure source channel
5 probe
6 heat conduction block
61 bottom recess
62 negative pressure passage
7 suction nozzle
8 O ring
9 spring
Cb lower chip
Cbt upper surface
Ctt upper surface
Cs internal accommodation space
Ct upper chip
Ctb lower surface
SC upper chip carrier
TM heat dissipation module

What is claimed is:

1. An apparatus for testing a package-on-package semiconductor device, comprising:
a top cover;
a lower base arranged under the top cover, the top cover and the lower base forming an internal accommodation space for receiving an upper chip;
a heat dissipation module including a heat sink, which is arranged in the internal accommodation space and attached to an upper surface of the upper chip;
a plurality of probes arranged in the lower base for electrically connecting the upper chip with a lower chip; and
a suction nozzle;
wherein the heat dissipation module further includes a heat conduction block, the lower base includes a hollow portion, and the heat conduction block is arranged in the hollow portion between the upper chip and the lower chip; and
wherein the heat conduction block includes a bottom recess and a negative pressure passage, the suction nozzle is provided in the bottom recess, and the negative pressure passage is communicated with the suction nozzle and coupled to a negative pressure source.

2. The apparatus of claim 1, wherein the plurality of probes are disposed in the lower base and distributed around the hollow portion, each of the plurality of probes penetrates the lower base and protrudes out of an upper surface and a lower surface of the lower base so as to be in electrical contact with the upper chip and with the lower chip.

3. The apparatus of claim 1, wherein the lower base includes a negative pressure source channel, through which the negative pressure passage of the heat conduction block is communicated with the negative pressure source.

4. The apparatus of claim 3, further including an O ring arranged at an interface between the negative pressure source channel of the lower base and the negative pressure passage of the heat dissipation block.

5. The apparatus of claim 1, wherein the top cover includes an aperture, the heat sink includes a bottom plate portion and a fin portion vertically provided on the bottom plate portion, a lower surface of the heat sink is attached to the upper surface of the upper chip, and the fin portion is extended out of the aperture.

6. The apparatus of claim 5, further including at least one spring, which is provided in the internal accommodation space between the top cover and the bottom plate portion of the heat sink.

7. An apparatus for testing a package-on-package semiconductor device, comprising:
an upper chip carrier for carrying an upper chip;
a heat dissipation module provided on the upper chip carrier, wherein the heat dissipation module includes a heat sink, which is in contact with an upper surface of the upper chip; and
a suction nozzle;
wherein the heat dissipation module further includes a heat conduction block which is arranged on a lower surface of the upper chip and in contact with an upper surface of a lower chip; and
wherein the heat conduction block includes a bottom recess and a negative pressure passage, the suction nozzle is provided in the bottom recess, and the negative pressure passage is communicated with the suction nozzle and coupled to a negative pressure source.

* * * * *